(12) United States Patent
Kahlert et al.

(10) Patent No.: US 8,432,035 B2
(45) Date of Patent: Apr. 30, 2013

(54) METAL CAP LAYER WITH ENHANCED ETCH RESISTIVITY FOR COPPER-BASED METAL REGIONS IN SEMICONDUCTOR DEVICES

(75) Inventors: Volker Kahlert, Dresden (DE); Christof Streck, Coswig (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/297,860

(22) Filed: Nov. 16, 2011

(65) Prior Publication Data

US 2012/0061839 A1 Mar. 15, 2012

Related U.S. Application Data

(62) Division of application No. 12/493,366, filed on Jun. 29, 2009, now Pat. No. 8,084,354.

(30) Foreign Application Priority Data

Sep. 30, 2008 (DE) .......................... 10 2008 049 775

(51) Int. Cl.
*H01L 23/48* (2006.01)
*H01L 21/4763* (2006.01)

(52) U.S. Cl.
USPC .... 257/751; 257/758; 257/774; 257/E23.011; 257/E23.145; 257/E21.575; 257/E21.577; 438/622; 438/637; 438/672; 438/745

(58) Field of Classification Search .................. None
See application file for complete search history.

(56) References Cited

U.S. PATENT DOCUMENTS

| 6,174,803 B1* | 1/2001 | Harvey ................. 438/638 |
| 8,084,354 B2* | 12/2011 | Kahlert et al. ........... 438/622 |
| 2004/0147117 A1* | 7/2004 | Ngo et al. ............... 438/687 |
| 2004/0238961 A1* | 12/2004 | Cunningham .......... 257/758 |
| 2012/0003759 A1* | 1/2012 | Hu et al. ................ 438/8 |

* cited by examiner

*Primary Examiner* — Alonzo Chambliss
(74) *Attorney, Agent, or Firm* — Williams, Morgan & Amerson, P.C.

(57) ABSTRACT

During the fabrication of sophisticated metallization systems of semiconductor devices, material deterioration of conductive cap layers may be significantly reduced by providing a noble metal on exposed surface areas after the patterning of the corresponding via openings. In one embodiment, a semiconductor device is provided that includes a metallization system formed above a substrate. The metallization system includes a metal line formed in a dielectric layer and having a top surface. The metallization system also includes a conductive cap layer formed on the top surface. A via extends through the conductive cap layer and connects to the top surface of the metal line. A conductive barrier layer is formed on sidewalls of the via. An interface layer is formed of a noble metal between the conductive cap layer and the conductive barrier layer and between the top surface of the metal line and the conductive barrier layer.

16 Claims, 3 Drawing Sheets

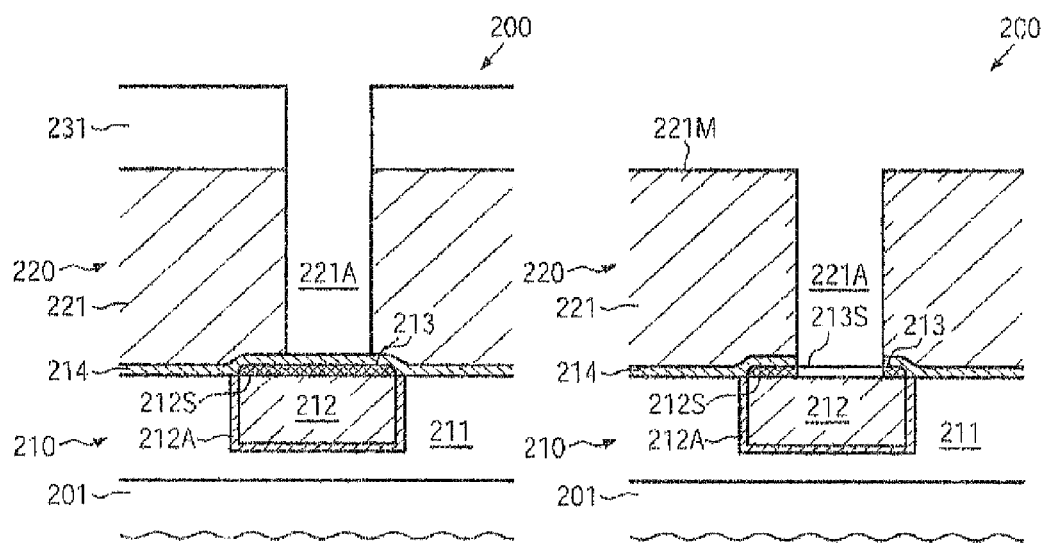
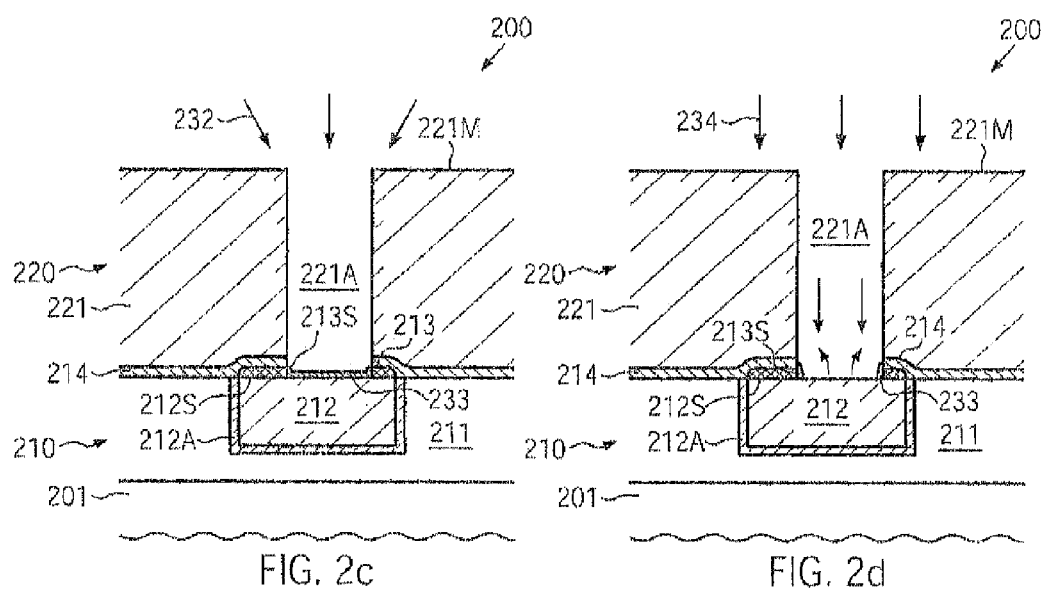

METAL CAP LAYER WITH ENHANCED ETCH RESISTIVITY FOR COPPER-BASED METAL REGIONS IN SEMICONDUCTOR DEVICES

CROSS-REFERENCE TO RELATED APPLICATION

This is a divisional of application Ser. No. 12/493,366, filed Jun. 29, 2009 now U.S. Pat. No. 8,084,354.

BACKGROUND OF THE INVENTION

1. Field of the Invention

Generally, the present disclosure relates to microstructures, such as advanced integrated circuits, and, more particularly, to conductive structures, such as copper-based metallization layers including metal cap layers to reduce electromigration during operation.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these inter-connect lines are also reduced to compensate for a reduced amount of available floor space and for an increased number of circuit elements provided per unit die area, as typically the number of interconnections required increases more rapidly than the number of circuit elements. Thus, usually, a plurality of stacked "wiring" layers, also referred to as metallization layers, is provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.05 µm and even less, may, therefore, typically be operated at significantly increased current densities of up to several kA per cm$^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores, resulting in a net momentum in the direction of electron flow. In particular at high current densities, a significant collective motion or directed diffusion of atoms may occur in the interconnect metal, wherein the presence of respective diffusion paths may have a substantial influence on the displaced amount of mass resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 µm or less, may require significantly reduced cross-sectional areas of the metal lines and, thus, increased current densities, which may render aluminum less attractive for the formation of metallization layers.

Consequently, aluminum is being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine, and the like, into the copper. Furthermore, the conductive barrier layers may also provide highly stable interfaces with the copper, thereby reducing the probability for significant material transport at the interface, which is typically a critical region in view of increased diffusion paths. Currently, tantalum, titanium, tungsten and their compounds, with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 µm or even less, in combination with trenches having a width ranging from 0.1 µm to several µm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or less, in order to find new materials and process strategies for forming copper-based lines and vias with a low overall permittivity. Although the exact mechanism of electromigration in copper lines is still not quite fully understood, it turns out that voids positioned in and on sidewalls, and especially at interfaces to neighboring materials, may have a significant impact on the finally achieved performance and reliability of the interconnects.

One failure mechanism, which is believed to significantly contribute to a premature device failure is the electromigration-induced material transport, particularly along an interface formed between the copper and a dielectric cap layer, which may be provided after filling in the copper material in the trenches and via openings, the sidewalk of which are coated by the conductive barrier materials. Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall conductivity of the corresponding metal line. For instance, a compound of cobalt/tungsten/phosphorous (CoWP) has proven to be a promising candidate for conductive cap layers, which may significantly reduce electromigration effects within a corresponding metal line.

Although the above-specified alloy provides superior electromigration performance and may be efficiently implemented into the overall process flow for manufacturing complex metallization systems, since this alloy may be readily deposited on the basis of selective electrochemical deposition recipes, it turns out, however, that severe defects may be observed during the patterning of vias connecting to metal regions having formed thereon typical conductive cap layers, in particularly when dielectric materials of reduced dielectric constant are used, as will be described in more detail with reference to FIGS. 1a-1b.

FIG. 1a schematically illustrates a cross-sectional view of a semiconductor device 100 at an advanced manufacturing stage, i.e., during a manufacturing sequence for forming a metallization system. The semiconductor device 100 comprises a substrate 101, which may include circuit elements (not shown) according to the specific circuit configuration of the device 100. The semiconductor device 100 further comprises a first metallization level 110 and a second metallization layer 120. As previously explained, the metallization layer 110 comprises a dielectric material 111, for instance in the form of a low-k dielectric material, in which is formed a metal line 112 comprised of copper, in combination with a barrier layer 112A that may be formed on the basis of tantalum nitride, tantalum and the like. Furthermore, a top surface 112S of the metal region 112 has formed thereon a conductive cap Layer 113 comprised of an alloy including cobalt/tungsten/phosphorous (CoWP). Furthermore, a dielectric etch stop layer 114, for instance provided as silicon dioxide, silicon carbide, nitrogen-containing silicon carbide and the like, is formed above the dielectric layer 111 and partially above the metal line 112 so as to be in contact with the conductive cap layer 113. In the manufacturing stage shown, the further metallization layer 120 comprises a dielectric material 121 of any appropriate composition, in which is formed a via opening 121A, wherein the dielectric material 121 may represent a lower portion of a dielectric layer stack for the layer 120 if a single damascene strategy is considered, or a trench (not shown) may be formed in the upper portion of the dielectric layer 121.

The semiconductor device 100 as shown in FIG. 1a is typically formed on the basis of well-established process techniques including the formation of circuit elements (not shown), followed by the fabrication of an appropriate contact structure (not shown), above which a plurality of metallization layers, such as the layers 110, 120, are formed. For this purpose, the dielectric material 111 is deposited, for instance, by chemical vapor deposition (CVD) and the like, followed by a patterning sequence for forming an appropriate trench in the layer 110, possibly in combination with respective via openings (not shown), depending on the overall process requirements. A respective etch process for forming a via opening will be discussed with reference to the via opening 121A. Next, a barrier layer is deposited and subsequently the copper material is filled in, for instance, by electroplating, thereby possibly requiring the deposition of an appropriate seed material. Thereafter, any excess material of the copper and the barrier layer 112A are removed, for instance by electrochemical etch techniques, chemical mechanical polishing (CMP) and the like. Subsequently, the exposed surface 112S is "passivated" by depositing the conductive cap layer 113, thereby also providing the desired strong interface at the surface 112S in view of a superior electromigration performance, as is discussed above. The deposition of the CoWP alloy may be accomplished by electroless plating, during which the exposed surface 112S acts as a catalyst material for initiating the electrochemical reaction when exposed to an appropriate electrolyte solution. Thus, a self-aligned deposition mechanism is obtained, since the deposition is substantially restricted to the exposed copper surface 112S. After depositing a desired thickness, for instance approximately 10-50 nm, the dielectric etch stop layer 114 may be deposited, for instance by CVD, followed by the deposition of the dielectric material 121. Next, a complex patterning sequence is performed, which finally results in the via opening 121A so as to extend down and into the dielectric etch stop layer 114, which is finally opened on the basis of well-established etch recipes.

As is well known, during complex plasma assisted etch processes, a plurality of etch byproducts are generated, at least some of which may also deposit on exposed surface areas and which may have to be removed prior to a subsequent deposition of a material within the opening 121A, such as a conductive barrier material. Consequently, respective wet chemical etch recipes 115 are typically applied, such as diluted hydrofluoric acid, ammonia peroxide mixtures and the like, possibly in combination with corrosion inhibiting agents, such as BTA, which have proven to be efficient recipes for conditioning exposed surface portions prior to the further processing of the device 100. Furthermore, in sophisticated applications, the dielectric material 121 may comprise material of reduced dielectric constant, for instance with a k-value of approximately 3.0 or 2.7 and less, which may typically be referred to as an ultra low-k (ULK) material, which may experience a certain degree of modification on exposed surface portions due to the preceding complex patterning process. For example, any resist removal processes, which are typically performed on the basis of oxygen plasma, may have a significant influence on the characteristics of the exposed surface areas of the dielectric material 121. Thus, a more or less pronounced damage zone may be created in the material 121 in the vicinity of exposed surface areas, which, according to many process strategies, are considered as inappropriate for the further processing and the finally obtained reliability of the corresponding metallization system. Thus, respective damaged surface areas of the dielectric material 121 may frequently be removed on the basis of the wet chemical etch recipe 115, which, in this case, may frequently include hydrofluoric acid. Consequently, during the process 115, an exposed portion of the conductive cap layer 113 may come into contact with the wet chemical agent, wherein it is believed that a significant electrochemical reaction may occur, in particular when the surface 112S is exposed in a more or less pronounced manner prior to or during the wet chemical etch process 115. Without intending to restrict the present application to the following explanation, it is assumed that a galvanic element may be created between the metal of the conductive cap layer 113 and the copper material in the region 112, thereby resulting in a significant material removal of the conductive cap layer 113.

FIG. 1b schematically illustrates the semiconductor device 100 after the wet chemical cleaning process 115. As illustrated, a significant degree of under-etching 113A may occur, thereby producing respective voids in the layer stack of the metallization layer 120, which may thus result in process non-uniformities during the further processing, thereby also degrading overall performance of the via after filling in a barrier material and copper. Furthermore, any oxygen in the wet chemical solution of the process 115 may even further promote the material removal of the conductive cap layer 113. For this reason, great efforts are currently being made so as to substantially avoid the creation of the under-etched areas 113A, for instance by identifying wet chemical etch chemistries for efficiently cleaning the surface and/or removing any damaged material of the dielectric layer 121, substantially without attacking the conductive cap layer. However, respective wet chemical etch chemistries may suffer from reduced efficiency. In other approaches, avoidance of oxygen is contemplated which, however, may be difficult to be implemented in volume production.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended, to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which enhanced etch resistivity of a conductive cap layer may be achieved when exposed to a wet chemical etch chemistry upon patterning a via opening of a metallization system. To this end, the exposed portions of the conductive cap layer may be covered by a material having an increased etch resistivity, such as a noble metal, which may provide a desired high degree of integrity of the conductive cap layer, even if portions of a metal line may be exposed during the wet chemical treatment. The coverage of exposed portions of the conductive cap layer may be accomplished, in some illustrative aspects disclosed herein, on the basis of selective deposition techniques, which may thus not significantly contribute to the overall process complexity, while on the other hand providing the possibility of using well-established and highly efficient wet chemical etch recipes, such as hydrofluoric acid and the like. Consequently, a high degree of compatibility with conventional process strategies and corresponding materials may be maintained without unduly contributing to overall process complexity. For instance, a damaged surface portion of a sensitive dielectric material may be efficiently removed on the basis of appropriate chemical etch techniques substantially without removing material of the conductive cap layer.

One illustrative semiconductor device disclosed herein comprises a metallization system formed above a substrate. The metallization system comprises a metal line formed in a dielectric layer and having a top surface, wherein the metal line is comprised of a first metal material. Furthermore, a conductive cap layer is formed on the top surface and is comprised of a second metal material other than the first metal material. Additionally, the Metallization system comprises a via extending through the conductive cap layer and connecting to the top surface of the metal line, wherein the via comprises a conductive barrier layer, at least on sidewalls thereof. Finally, the metallization system comprises an interface layer formed between the conductive cap layer and the conductive bather layer, wherein the interface layer is comprised of a metal that is more noble than a metal of the conductive cap layer.

One illustrative method disclosed herein comprises forming an opening in a layer stack formed above a substrate of a semiconductor device, wherein the layer stack comprises a conductive cap layer formed on a metal line and a dielectric material formed above the conductive cap layer. The method further comprises forming a protection layer on an exposed portion of at least the conductive cap layer in the opening. Finally, the method comprises performing a wet chemical treatment after forming the protection layer that substantially maintains integrity of the portion when performing the wet chemical treatment.

A still further illustrative method disclosed herein relates to forming a via in a metallization system of a semiconductor device. The method comprises forming an opening in a dielectric layer of the metallization system so as to extend at least into a conductive cap layer formed on a metal region. The method further comprises selectively forming a noble metal protection layer on a portion of the conductive cap layer that is exposed in the opening. Moreover, a wet chemical treatment is performed and the opening is filled with a metal-containing material after the wet chemical treatment.

BRIEF DESCRIPTION OF THE DRAWINGS

The disclosure may be understood by reference to the following description taken in conjunction with the accompanying drawings, in which like reference numerals identify like elements, and in which:

FIGS. 2a-2c schematically illustrate cross-sectional views of a semiconductor device during various manufacturing stages in forming an opening connecting to a metal region that is covered by a conductive cap layer, wherein exposed portions of the conductive cap layer are selectively confined by a protection layer, according to illustrative embodiments;

FIG. 2d schematically illustrates a semiconductor device in a manufacturing stage in which portions of the conductive cap layer exposed in a via opening are covered by material sputtered off from the metal region, according to further illustrative embodiments;

Figure 1A:
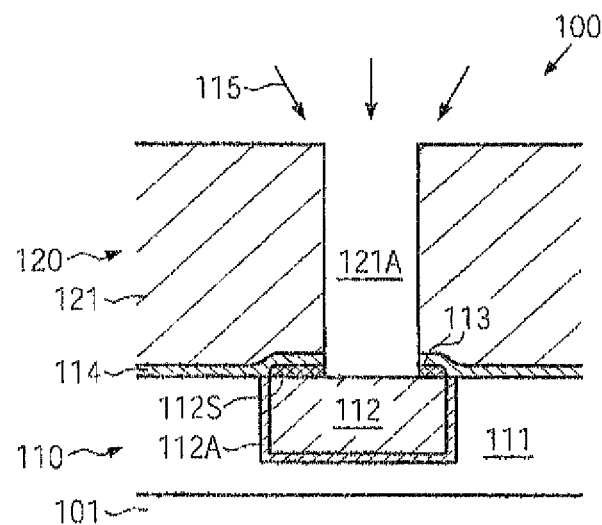
FIGS. 1a-1b schematically illustrate cross-sectional views of a semiconductor device during the patterning of a dielectric material for forming a via opening connecting to a copper-containing metal line having formed thereon a CoWP cap layer, according to conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning us understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and semiconductor devices in which well-established wet chemical etch recipes may be used during the patterning of sophisticated metallization systems by covering exposed portions of a conductive cap material on the basis of an inert material, such as a noble metal, which, in some illustrative embodiments, may also cover an exposed surface area of a metal region, such as a copper-containing region, thereby also providing a substantially inert behavior during the corresponding wet chemical etch process. The protection layer may be applied in a highly selective manner, i.e., a significant coverage of dielectric material may be avoided so that the further processing of the device, as well as the wet chemical treatment, may be performed on the basis of well-established process strategies. In some illustrative embodiments disclosed herein, the selective deposition of an appropriate inert material, such as a noble metal, may be accomplished by performing CVD techniques and/or atomic layer deposition (ALD) techniques, for which a plurality of recipes are well established and may be used to cover exposed portions of the conductive cap layer by a noble metal. In this case, the well-known characteristic of corresponding CVD and/or ALD processes may be used, since the nucleation of a corresponding material, such as a noble metal, on dielectric surface areas may be significantly delayed with respect to a corresponding deposition on metal surfaces. For example, in an ALD process, which is to be understood as a process technique in which a self-limiting deposition behavior may be achieved, respective deposition cycles may be performed, each of which may exhibit the delayed nucleation at dielectric surface areas so that, in total, a thin metal layer may be formed on exposed metal-containing surface areas, while a deposition of the metal material on dielectric surface arms may be substantially avoided. A similar deposition behavior may also be observed in CVD processes, so that, based on appropriately selecting deposition parameters and controlling the deposition time, a high degree of selectivity with respect to metal surfaces and dielectric surface areas may be accomplished. On the other hand, a moderately thin protection layer comprised of a noble metal may provide the desired inertness of the conductive cap layer and, if required, of the surface of the metal region with respect to a plurality of wet chemical etch recipes, such as diluted hydrofluoric acid and the like, in combination with any rinse solutions, such as de-ionized water, while also protecting against oxygen-induced corrosion upon contact with other process gases and a clean room ambient, which may result in increased flexibility in designing the overall process flow, as respective queue time effects, which may conventionally be encountered after exposing the conductive cap layer, and possibly the metal line may be reduced.

In other illustrative embodiments a certain degree of selective formation of an inert material on exposed portions of the conductive cap layer may be accomplished by re-sputtering material of the metal region, such as copper, which may also have a high etch resistivity with respect to hydrofluoric acid.

Thus, after the patterning of the via opening, a corresponding "sputter etch" process may be initiated on the basis of appropriate process parameters to redistribute material from the exposed copper-containing metal region onto lower sidewall portions of the via, thereby also forming a copper-based protection layer or covering the conductive cap layer. In still other illustrative embodiments, a selective deposition of an appropriate metal may be accomplished on the basis of electrochemical deposition recipes, such as electroless plating, in which at least the exposed surface area of the metal region may act as a catalyst material, thereby enabling a substantially selective deposition of a desired material, such as a noble metal, which may also reliably confine the conductive cap layer. Consequently, a high degree of compatibility with conventional strategies may be obtained, for instance in view of removing contaminants after the patterning of the dielectric material and possibly removing damaged areas of the sensitive dielectric material, since well-established wet chemical etch recipes may be used, without significantly contributing to additional process complexity compared to conventional approaches.

Figure 1B:
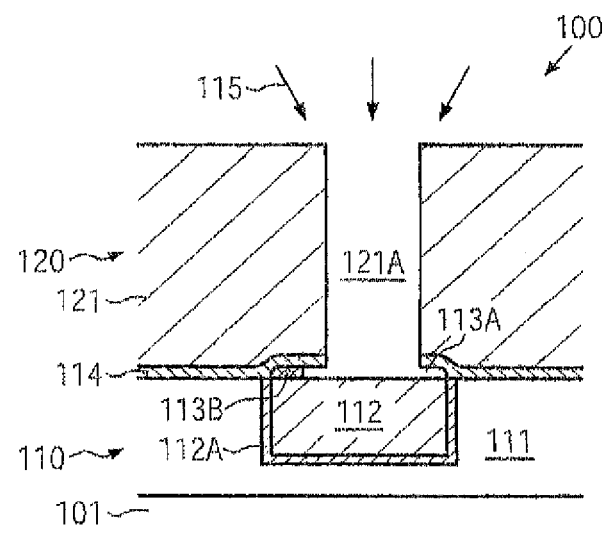
Figure 2E:
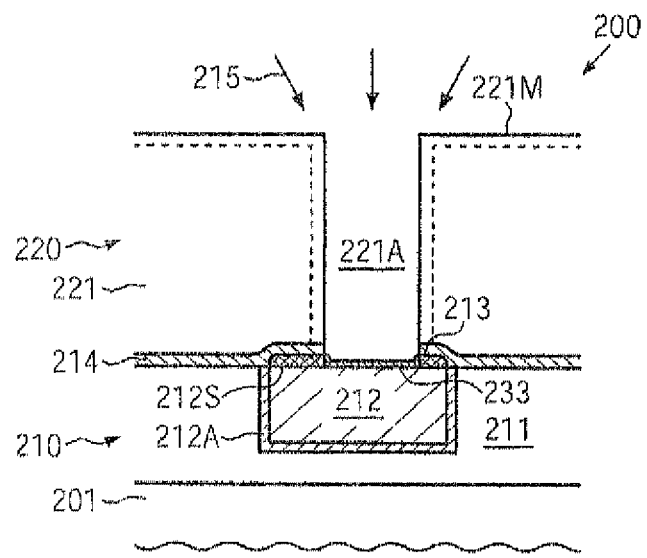
FIG. 2e schematically illustrates a semiconductor device in a further advanced manufacturing stage, when etch byproducts and/or damaged areas of a dielectric material are removed by a wet chemical treatment, according to illustrative embodiments, while integrity of the conductive cap material is maintained by a protection layer.

With reference to FIGS. 2a-2f, further illustrative embodiments will now be described in more detail, wherein reference may also be made to FIGS. 1a-1b if appropriate FIG. 2a schematically illustrates a cross-sectional view of a semiconductor device 200 comprising a substrate 201, above which may be formed a metallization system. For example, the metallization system may represent the "wiring system" of a sophisticated semiconductor device, which may have formed in and above the substrate 201 a plurality of circuit elements, such as transistors and the like, as required according to the overall configuration of the device 200, as will also be explained in more detail later on. The metallization system may comprise a plurality of metallization layers, as previously discussed. For instance, a metallization layer 210 may be provided and may comprise a dielectric material 211, in which a metal region 212 may be formed, which may comprise a highly conductive metal, such as copper and the like. Furthermore, as previously explained, in copper-based metallization regimes, typically, a conductive barrier material 212A may be provided to confine the copper material and provide the desired adhesion to the neighboring dielectric material 211. With respect to the dielectric material 211 and the metal region 212, it may also be referred to the corresponding components of the semiconductor device 100 described with reference to FIGS. 1a-1b. Furthermore, a conductive cap layer 213, for instance comprised of an alloy including cobalt/tungsten/phosphorous, or any other appropriate material composition, may be formed on a surface 212S of the metal region 212. It should be appreciated that a plurality of copper-confining metal compositions may be used instead of or additionally to the above-specified alloy. For instance, appropriate materials may be a compound comprised of cobalt/tungsten/boron (CoWB), a compound comprised of nickel/molybdenum/boron. (NiMoB), a compound comprised of nickel/molybdenum/phosphorous (NiMoP) and the like.

Furthermore, the metallization system may comprise a further layer 220, such as a via layer, or a metallization layer which may comprise metal lines and vias, as will be described later on in more detail. The layer 220 may comprise a dielectric material 221, which may be comprised of low-k dielectric material in sophisticated applications, wherein a dielectric constant may be 3.0 and less, such as 2.0 and less, wherein such materials may also be referred to as ULK materials. The dielectric layer 221 may be formed on one or more other dielectric materials 214, which may provide desired characteristics, for instance with respect to adhesion, etch stop capability and the like. For instance, the layer 214 may act as an etch stop material and/or may provide enhanced adhesion of the material 221 to the metallization layer 210, if highly sensitive low-k or ULK materials are considered. Furthermore, in the manufacturing stage shown, an etch mask 231 may be provided which may be used for forming an opening 221A in the dielectric material 221.

The semiconductor device 200 as shown in FIG. 2a may be formed on the basis of well-established process techniques, as are also described with reference to FIG. 1a. That is, the metallization layer 210 may be formed in accordance with any appropriate manufacturing techniques for providing the material 211 and forming therein the metal region 212 and the conductive cap layer 213 on the basis of any desired material composition so as to enhance electromigration behavior and the like, as discussed above. Thereafter, the material 214 may be deposited on the basis of well-established techniques, followed by forming the dielectric material 221, which may subsequently be patterned on the basis of the mask 231 to obtain the opening 221A, while, in the embodiment shown, the layer 214 may be used as an efficient etch stop material.

FIG. 2b schematically illustrates the semiconductor device 200 in an advanced manufacturing stage, i.e., after performing a further etch sequence to open the material layer 214 and to etch into the dielectric cap layer 213, wherein, in some illustrative embodiments, a part of the surface 212S of the metal region 212 may also be exposed within the opening 212A. Furthermore, at any appropriate stage of the corresponding patterning sequence, the resist mask 231 may be removed, which may finally result in a certain degree of surface modification of exposed surface areas of the dielectric material 221, as is indicated by 221M, when sensitive dielectric materials are used. Hence, the device 200 as illustrated in FIG. 2b may comprise a plurality of surface contaminations, for instance in the form of etch byproducts, such as polymer residues, as may have been created during the preceding etch steps, while the modified portions 221M, if created, may also be considered as material portions that may haw to be removed prior to the further processing of the device 200 for filling the opening 221A with a metal-containing material. Furthermore, a portion 213S of the conductive cap layer 213 may be exposed and may exhibit an increased removal rate with respect to wet chemical etch chemistries, which may efficiently be used for removing contaminants, the modified portion 221M and the like.

FIG. 2c schematically illustrates the semiconductor device 200 during a selective deposition process 232 that is designed to at least cover the sidewall portions 213S of the conductive cap layer 213. In one illustrative embodiment, the selective deposition process 232 may represent a CVD process so as to selectively deposit a noble metal preferably on exposed metal-containing surface areas. In this case, well-established CVD process recipes may be used, in which appropriate precursor materials, such as organo metallic precursors including the desired metal component, inorganic precursor gases and the like, in combination with appropriate carrier gases, may be supplied to a deposition ambient, which may be established in available deposition tools. For instance, precursor gases including ruthenium, iridium, platinum and the like may be used to provide a noble metal component in the deposition ambient of the process 232. As previously indicated, according to well-established CVD recipes, the nucleation and thus deposition may require significantly different time intervals for metal-containing surface areas, such as the exposed sidewall portions 213S, compared to dielectric surface areas, such as any surfaces of the material 221, for instance in the form of modified portions 221M. Consequently, by appropriately adjusting the deposition time of the process 232, a protection layer 233 may be formed on exposed metal-containing areas, such as the portions 213S and possibly the surface 212S, if exposed during the preceding patterning sequence. In other cases, when material of the layer 213 is still formed on the surface 212S, the protection layer 233 may also be formed so as to cover the remaining material of the layer 213, thereby also providing a high degree of integrity during the subsequent manufacturing processes. It should be appreciated that an appropriate process time during the deposition process 232 may readily be determined on the basis of corresponding test runs, in which a layer thickness on dielectric surface areas and metal-containing surface areas may be determined for a plurality of different deposition times. For instance, the protection layer 233 may have an average thickness of approximately 0.5-5.0 nm, without adding a significant degree of material deposition on the exposed portions 221M of the material 221. It should be appreciated that isolated minute material areas formed by the deposition process 232 on the surface areas 221M may efficiently be removed during the subsequent wet chemical etch process, since, in this case, the corresponding isolated metal "islands" may efficiently be under-etched and finally removed.

In other illustrative embodiments, the selective deposition process 232 may represent an ALD process, in which a self-limiting deposition behavior may be obtained, for instance providing different precursor materials in successive deposition steps to obtain a final layer of material having a well-defined thickness. Thus, by adjusting the number of successive deposition cycles, the finally obtained thickness of the layer 233 may be adjusted. Corresponding self-limiting deposition recipes are well established and are available for a plurality of noble metals, as are identified above. Also, in this case, during each individual deposition cycle, the deposition time may be adjusted to obtain a significant material deposition on exposed metal surfaces only, while substantially avoiding material deposition on the exposed dielectric surface portions 221M.

In still other illustrative embodiments, the selective deposition process 232 may represent an electrochemical deposition step, for instance in the form of an electroless deposition process, in which the exposed surface areas 213S and/or 212S may act as a catalyst material for initiating the deposition of a corresponding metal material. For instance, any of the above-identified noble metals may be deposited by electroless plating, wherein at least the exposed surface 212S may act as a catalyst material. In this case, a growth of the noble metal from bottom to top may be obtained, thereby also reliably covering the sidewall portions 213S of the conductive cap layer 213. In some illustrative embodiments, even copper material may be grown on the exposed surface 212S up to a height so as to reliably cover the portions 213S, while overall confinement of the copper material may be accomplished by the layer 214.

Consequently, on the basis of the selective deposition process 232, at least the portions 213S may be passivated, while, in sonic illustrative embodiments, the exposed portion of the surface 212S may also be covered by the protection layer 233, thereby providing enhanced integrity during the further handling of the substrate 200 and the further processing on the basis of a wet chemical treatment.

FIG. 2d schematically illustrates the semiconductor device 200 according to further illustrative embodiments. In this case, the protection layer 233 may be formed in a locally selective manner by a redistribution of material of the region 212 onto lower sidewall portions of the opening 221A. In one illustrative embodiment, the process 234 may represent a sputter process in which appropriate ionic particles, such as argon ions and the like, may be created in a plasma ambient and may be accelerated towards the substrate 201. Thus, atoms may be sputtered off, preferably from horizontal device portions caused by the particle bombardment, which may result in the opening 221A in the release of copper atoms, which may immediately be re-deposited and which may thus form the protection layer 233 as a type of sidewall spacer protecting the portions 213S. It should be appreciated that appropriate process parameters, such as high frequency power for creating an appropriate plasma, bias power, pressure and the like, may readily be established on the basis of test runs and the like. For instance, by appropriately selecting the average kinetic energy of the particles and an appropriate process pressure, the re-deposition of the material of the metal region 212 may be substantially restricted to a height that is equal to or less than a height level defined by the layer 214. Consequently, a lateral copper confinement may still be maintained, since typically the material 214 may comprise a dielectric material that may provide superior copper diffusion blocking capabilities. Thus, an efficient passivation of the exposed portions 213S may be accomplished, since copper typically exhibits a high degree of inertness with respect to a plurality of wet chemical etch chemistries, such as hydrofluoric acid.

FIG. 2e schematically illustrates the semiconductor device 200 in a further advanced manufacturing stage in which a wet chemical treatment 215 may be performed to remove surface contaminations and/or material of the layer 221, such as the modified surface portions 221M, as discussed above. During the wet chemical treatment, which may, in some illustrative embodiments, be performed on the basis of hydrofluoric acid, the protection layer 233 may maintain integrity of the conductive cap layer 213, thereby providing a high degree of flexibility in selecting appropriate etch parameters, as may be required for removing the portion 221M, if desired, and the like. Thereafter, the further processing may be continued, for instance, by depositing a conductive barrier layer followed by the deposition of a desired metal, such as copper, which may be accomplished by well-established process techniques. Thus, prior to, during and after the wet chemical treatment 215, the protection layer 233 may confine the conductive cap layer 213 and possibly the metal region 212 so that any erosion or other effects may be substantially avoided, even if the manufacturing processes are performed in an oxygen-rich environment, such as the standard clean room ambient. For this reason, any pronounced queue time effects for the semiconductor device 200 in a manufacturing stage after patterning the opening 221A may be substantially reduced, thereby providing enhanced flexibility in designing the overall manufacturing flow.

Figure 2F:
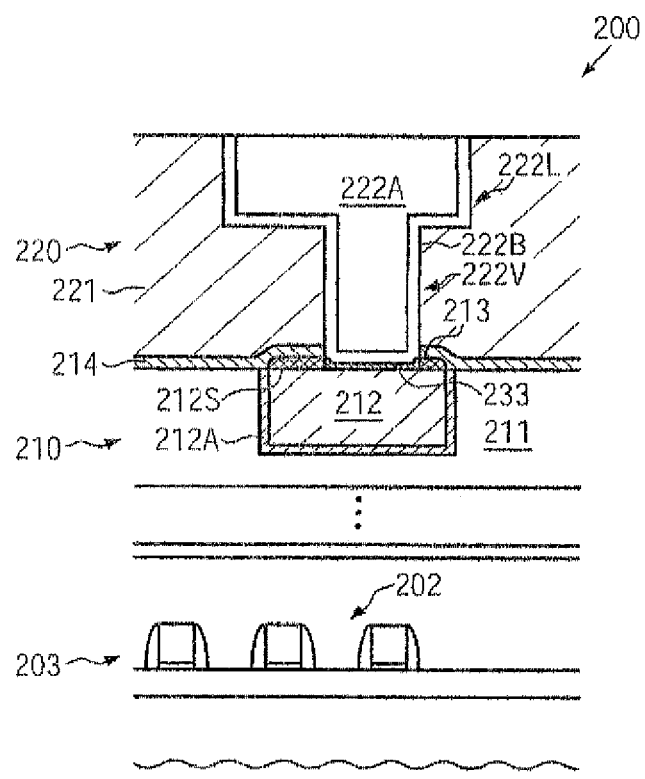
FIG. 2f schematically illustrates a cross-sectional view of the semiconductor device, according to further illustrative embodiments, in which a trench and a via opening are formed in a common process sequence, while the conductive cap layer is confined by a protection layer.

FIG. 2f schematically illustrates the semiconductor device 200 in a further advanced manufacturing stage according to some illustrative embodiments. As illustrated, the semiconductor device 200 may comprise a device level 203, which may represent a semiconductor material such as a silicon-based material and the like, in and above which a plurality of circuit elements, such as transistors 202, may be formed in accordance with design rules corresponding to the device 200. For example, as previously explained, in sophisticated applications, the transistor elements 202 may have critical dimensions of approximately 50 nm and less. It should be appreciated that a critical dimension may be understood as a minimum dimension that has to be reliably formed in the device level under consideration so as to obtain a specified device performance. For example, the length of a gate electrode structure may represent a critical dimension of the transistors 202. Above the device level 203, any other appropriate further levels may be provided, for instance a contact structure (not shown) designed to connect contact areas of the circuit elements 202 with the metallization system. Furthermore, as previously explained, the metallization system may comprise a plurality of metallization layers, such as layers 210 and 220, wherein, in the embodiment shown, the metallization layer 220 may comprise a metal line 222L in combination with a via 222V, which may connect to the metal region 212 as is also explained above with reference to FIG. 2e. The metal line 222L and the via 222V may be filled with a conductive barrier material 222B and a highly conductive metal, such as copper 222A. Moreover, as illustrated, in the embodiment shown, the protection layer 233 may be substantially maintained so that, at least between the conductive cap layer 213 and the conductive barrier layer 222b, the material of the protection layer 233 may act as an interface.

The semiconductor device 200 as shown in FIG. 2f may be formed on the basis of process techniques as previously described. That is, the metal line 222L and the via 222V may be formed in accordance with a patterning regime based on a dual damascene technique, in which the opening for the via 222V, such as the opening 221A (FIG. 2e), may be formed first, followed by a corresponding trench opening for the metal line 222L, which may then be filled with the metal-containing materials 222B, 222A in a common process sequence. That is, the conductive barrier material 222B may be deposited, for instance by sputter deposition, CVD, ALD, electroless plating and the like, possibly followed by the deposition of a seed material, if required, and thereafter the material 222A may be filled into the via 222V and the metal line 222L. Thereafter, any excess material may be removed by CMP, electrochemical etch processes and the like. Thus, after etching the corresponding trench and completely opening the respective via opening, the protection layer 233 may be formed in accordance with process techniques as described above, thereby providing the desired integrity of the conductive cap layer 213.

As a result, the present disclosure provides techniques and semiconductor devices in which a conductive cap material may be efficiently passivated on the basis of an appropriate material, such as a noble metal and the like, after exposing the cap layer when patterning a corresponding via opening, thereby providing the possibility of using well-established wet chemical etch chemistries substantially without deteriorating the conductive cap layer. For this purpose, an appropriate material may be selectively provided, at least on an exposed portion of the conductive cap layer and possibly also on exposed surface areas of the underlying metal region, which may be accomplished by CVD/ALD processes, in which a significant nucleation and thus deposition of metal material on dielectric surface areas may be delayed with respect to exposed metal surfaces. Hence, by appropriately selecting the deposition time, a thin yet effective protection layer may be formed on exposed metal surfaces, such as exposed portions of the conductive cap layer, while significant material deposition on dielectric surface areas may be avoided. In other cases, an efficient redistribution of material, such as copper material, may be accomplished by re-sputtering. In even further illustrative embodiments, electrochemical deposition techniques may be used for selectively covering exposed metal surface areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a metallization system positioned above a substrate, said metallization system comprising:
   a metal line positioned in a dielectric layer and having a top surface, said metal line being comprised of a first metal material;
   a conductive cap layer positioned above said top surface, said conductive cap layer being comprised of a second metal material other than said first metal material;
   an etch stop layer is positioned above the conductive cap layer and substantially coplanar with and adjacent to a top surface of the dielectric layer;
   a via extending through said conductive cap layer and said etch stop layer and connecting to said top surface of said metal line, said via comprising a conductive barrier layer at least on sidewalls thereof; and
   an interface layer positioned between said conductive cap layer and said conductive barrier layer and between said top surface of the metal line and said conductive barrier layer, said interface layer comprised of a metal that is more noble than a metal of said conductive cap layer, wherein the interface layer is substantially restricted to a height that is equal to or less than a height level defined by a thickness of said etch stop layer.

2. The semiconductor device of claim 1, wherein said metal of said interface comprises at least one of ruthenium, iridium and platinum.

3. The semiconductor device of claim 1, wherein said second metal material comprises an alloy including cobalt.

4. The semiconductor device of claim 3, wherein said alloy is a ternary alloy.

5. The semiconductor device of claim 3, wherein said second metal material is comprised of an alloy including cobalt, tungsten and phosphorous.

6. The semiconductor device of claim 1, wherein said dielectric layer comprises a low-k dielectric material having a dielectric constant of approximately 2.7 and less.

7. The semiconductor device of claim 1, wherein said metal line is comprised of copper.

8. The semiconductor device of claim 1, further comprising transistor elements having a critical dimension of 50 nm or less.

9. A semiconductor device, comprising:
   a metallization system positioned above a substrate, said metallization system comprising:
   a metal line positioned in a dielectric layer and having a top surface, said metal line being comprised of a first metal material;
   a conductive cap layer positioned above said top surface, said conductive cap layer being comprised of a second metal material other than said first metal material;
   an etch stop layer positioned over the conductive cap layer and substantially coplanar with and adjacent to a top surface of the dielectric layer;
   a via extending through said conductive cap layer and said etch stop layer and connecting to said top surface of said metal line, said via comprising a conductive barrier layer at least on sidewalls thereof; and an interface layer adjacent sidewalls of said conductive cap layer in said via and between said conductive cap layer and said conductive barrier layer, wherein the interface layer is adjacent a portion of said top surface of said metal line and between said top surface of the metal line and said conductive barrier layer, said interface layer comprised of a metal that is more noble than a metal of said conductive cap layer, wherein the interface layer is substantially restricted to a height that is equal to or less than a height level defined by a thickness of said etch stop layer.

10. The semiconductor device of claim 9, wherein said metal of said interface comprises at least one of ruthenium, iridium and platinum.

11. The semiconductor device of claim 9, wherein said second metal material comprises an alloy including cobalt.

12. The semiconductor device of claim 11, wherein said alloy is a ternary alloy.

13. The semiconductor device of claim 11, wherein said second metal material is comprised of an alloy including cobalt, tungsten and phosphorous.

14. The semiconductor device of claim 9, wherein said dielectric layer comprises a low-k dielectric material having a dielectric constant of approximately 2.7 and less.

15. The semiconductor device of claim 9, wherein said metal line is comprised of copper.

16. The semiconductor device of claim 9, further comprising transistor elements having a critical dimension of 50 nm or less.

* * * * *